(12) United States Patent
He et al.

(10) Patent No.: US 11,127,886 B2
(45) Date of Patent: Sep. 21, 2021

(54) FLIP-CHIP LED WITH BARRIER STRUCTURE

(71) Applicant: XIAMEN SANAN OPTOELECTRONICS TECHNOLOGY CO., LTD., Xiamen (CN)

(72) Inventors: Anhe He, Xiamen (CN); Su-hui Lin, Xiamen (CN); Jiansen Zheng, Xiamen (CN); Kangwei Peng, Xiamen (CN); Xiaoxiong Lin, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 97 days.

(21) Appl. No.: 15/236,434

(22) Filed: Aug. 13, 2016

(65) Prior Publication Data
US 2016/0365488 A1 Dec. 15, 2016

Related U.S. Application Data

(63) Continuation of application No. PCT/CN2014/094876, filed on Dec. 25, 2014.

(30) Foreign Application Priority Data

Jun. 6, 2014 (CN) .......................... 201410248717.8

(51) Int. Cl.
*H01L 33/10* (2010.01)
*H01L 33/46* (2010.01)
*H01L 33/20* (2010.01)
*H01L 33/38* (2010.01)
*H01L 33/44* (2010.01)
*H01L 33/40* (2010.01)

(52) U.S. Cl.
CPC .............. *H01L 33/46* (2013.01); *H01L 33/20* (2013.01); *H01L 33/38* (2013.01); *H01L 33/44* (2013.01); *H01L 33/405* (2013.01); *H01L 2933/0016* (2013.01); *H01L 2933/0025* (2013.01)

(58) Field of Classification Search
CPC .......... H01L 33/08; H01L 33/20; H01L 33/46
See application file for complete search history.

(56) References Cited

U.S. PATENT DOCUMENTS 7,687,322 B1 * 3/2010 Doan .................. H01L 33/0093
438/141
9,728,682 B2 * 8/2017 Wang ...................... H01L 33/38
(Continued)

*Primary Examiner* — Suberr L Chi
(74) *Attorney, Agent, or Firm* — Syncoda LLC; Feng Ma

(57) ABSTRACT

A flip-chip light LED includes: a substrate; an epitaxial layer on the substrate, wherein, the epitaxial layer comprises: a first semiconductor layer, a second semiconductor layer and a light emitting layer between the first semiconductor layer and the second semiconductor layer; at least one opening structure, which is at the epitaxial layer edge and extends to the substrate surface, making parts of the side wall of the epitaxial layer and the substrate surface exposed, such that the epitaxial layer is divided into an epitaxial bulk layer and a barrier structure; and an insulating layer on the opening structure as the metal electrode isolating layer.

13 Claims, 7 Drawing Sheets

(56) References Cited

U.S. PATENT DOCUMENTS

| | | | |
|---|---|---|---|
| 2005/0189558 A1* | 9/2005 | Liu | H01L 33/08 |
| | | | 257/100 |
| 2005/0281303 A1* | 12/2005 | Horio | H01L 33/38 |
| | | | 372/44.01 |
| 2012/0267662 A1* | 10/2012 | Maute | H01L 33/20 |
| | | | 257/98 |
| 2015/0243706 A1* | 8/2015 | Oh | H01L 27/15 |
| | | | 257/88 |

* cited by examiner

FLIP-CHIP LED WITH BARRIER STRUCTURE

CROSS-REFERENCE TO RELATED APPLICATIONS

The present application is a continuation of, and claims priority to, PCT/CN2014/094876 filed on Dec. 25, 2014, which claims priority to Chinese Patent Application No. 201410248717.8 filed on Jun. 6, 2014. The disclosures of these applications are hereby incorporated by reference in their entirety.

BACKGROUND

Light-emitting diodes (LEDs), due to long service life and low energy consumption, are applied in various fields. Especially, with great improvement of lighting performance indicators, LED application extends widely to optical display device, traffic sign, data storage device, communication device, lighting device, etc. The III-V-group compound semiconductors, represented by GaN, have huge application potential in optoelectronic device fields like high-brightness blue-light LED, blue-light laser and attract widespread concerns, thanks to wide band gap, high lighting efficiency, high electron saturation drift velocity and stable chemical property.

However, current semiconductor LEDs may have low light-emitting efficiency. For normal un-packaged LED, a large amount of energy is aggregated inside the device and cannot be emitted, resulting in energy waste and reduction of the LED service life. Therefore, a major concern is to improve the light-emitting efficiency of the semiconductor LEDs. Based on application requirements, many methods to improve LED light-emitting efficiency have been applied in device structures, such transparent substrate, surface roughening, metal reflector structure, flip-chip, etc. Featured with large current, low voltage, high light-emitting efficiency and no-wire bonding, flip chip arises increasing interests.

At present, the flip-chip LED chip is designed in rectangle shape and layered stack structure composed of a substrate, an epitaxial layer, a P-type ohmic contact layer (also reflective metal layer), an insulating layer and an N-type ohmic contact layer from bottom to up, where the metal layer is a large face structure. Therefore, the design of insulating layer is particularly important. Once the insulating layer is broken, it may cause short-circuit of P and N electrodes; the insulating layer inside the chip is stable and not readily broken. However, the insulating layer at the chip edge is more prone to breaking during chip cutting. In addition, in consideration of light-emitting efficiency and current distribution of chip, in particular for large size chip design, size of P and N metal electrodes, limit position, if solder paste welding is adopted in package, it may cause uneven solder paste coating, overflow out of welding plate area, etc. If the insulating layer at chip edge is damaged, it may cause poor circuit and electric leakage, as shown in FIGS. 1 and 2, thus influencing package yield and promotion application of flip-chip.

SUMMARY

Various embodiments of the present disclose can overcome at least some of the deficiencies in existing technologies. In an aspect, a flip-chip LED chip with improved reliability and fabrication method is provided, adopting a special barrier structure in chip design and fabrication process to radically solve internal short-circuit of the chip caused by overflow of solder paste or other solid crystal conductive materials.

In some embodiments, a barrier structure is fabricated at the epitaxial layer edge of the flip-chip LED chip to overcome easy breaking of the cladding material of conventional chip insulating layer during chip cutting. In this way, a new type of insulating protection structure is formed to effectively protect the chip side wall, thus avoiding short-circuit of the chip caused by overflow of solder paste or other solid crystal conductive materials and improving chip reliability.

According to some embodiments, a flip-chip LED structure comprises: a substrate; an epitaxial layer on the substrate, wherein, the epitaxial layer comprises: a first semiconductor layer, a second semiconductor layer and a light emitting layer between the first semiconductor layer and the second semiconductor layer; at least one opening structure, which is on the epitaxial layer edge and extends to the substrate surface, making parts of the side wall of the epitaxial layer and the substrate surface exposed, so that the epitaxial layer is divided into an epitaxial bulk layer and a barrier structure; and an insulating layer on the opening structure as the metal electrode isolating layer.

The flip-chip LED structure may also comprise an additional reflective layer on the epitaxial layer before at least one opening structure is formed, wherein, the reflective layer can be a metal reflective layer, a distributed Bragg reflective layer or an omni-directional reflective layer; it may also comprise a metal electrode on the epitaxial layer after the insulating layer is formed.

In another aspect, a fabrication method of a flip-chip LED is provided, comprising: 1) providing a substrate; 2) fabricating an epitaxial layer on the substrate, wherein, the epitaxial layer comprises: a first semiconductor layer, a second semiconductor layer and a light emitting layer between the first semiconductor layer and the second semiconductor layer; 3) etching at least one opening structure downward from the epitaxial layer surface through etching process, which extends to the substrate surface, making parts of the side wall of the epitaxial layer and the substrate surface exposed, so that the epitaxial layer is divided into an epitaxial bulk layer and a barrier structure; and 4) deposit an insulating layer on the opening structure as the metal electrode isolating layer.

The aforesaid fabrication method of flip-chip LED may also comprise the process steps of: forming a reflective layer on the epitaxial layer before at least one opening structure is formed, wherein, the reflective layer can be a metal reflective layer, a distributed Bragg reflective layer or an omni-directional reflective layer; also, fabricate a metal electrode on the epitaxial layer after the insulating layer is formed.

In some embodiments, the opening structure is U-type, V-type, W-type or any of their combinations.

In some embodiments, the substrate can be a growth substrate, a heat-dissipating substrate, a bonding substrate or any of their combinations.

In some embodiments, the growth substrate material can be sapphire ($Al_2O_3$), silicon carbide (SiC), gallium nitride (GaN) or any of their combinations.

In some embodiments, the metal reflective layer comprises Ag, Al, Rh or any of their combinations.

In some embodiments, the insulating layer can be $SiO_2$, $SiN_x$, $TiO_2$ or any of their combinations.

In some embodiments, the metal electrode can be Ni/Au, Cr/Pt/Au, Ti/Al/Ti/Au or any of their combinations.

In another aspect, a light-emitting system is provided including a plurality of the flip-chip LEDs described above. The light-emitting system can be used in the areas such as lighting, displays, etc.

Compared with existing technologies, various embodiments of the present disclosure can have one or more of the following advantages: an opening is fabricated at the epitaxial layer edge of the flip-chip LED chip to form a peripheral or local barrier structure for insulating protection, which effectively protects the chip side wall and overcomes easy breaking of the cladding material of conventional chip insulating layer during chip cutting, thus avoiding short-circuit during usage of the chip due to overflow of solder paste or other solid crystal conductive materials and improving reliability and yield of the flip-chip LED chip.

Other features and advantages of various embodiments of the present disclosure will be described in detail in the following description.

Figure 1:
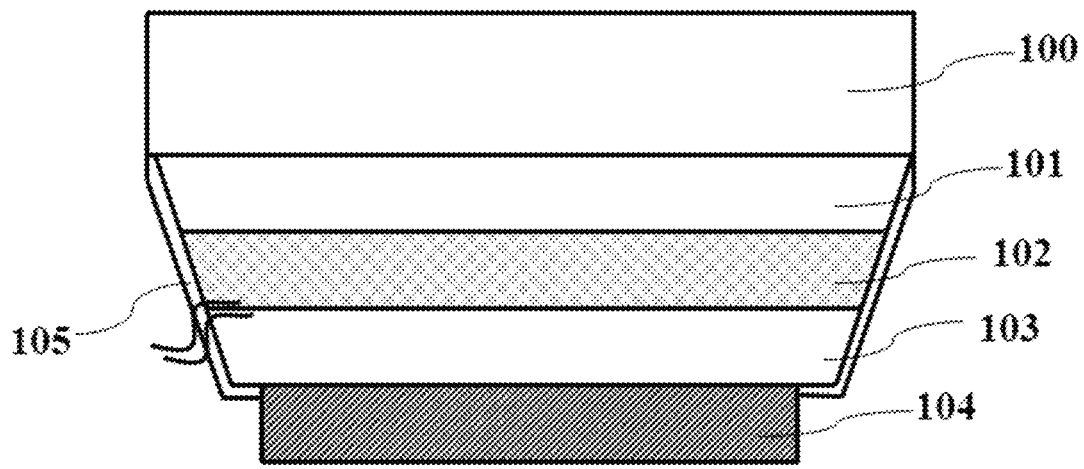
FIG. 1 is a sectional view of an existing flip-chip LED.
Figure 2:
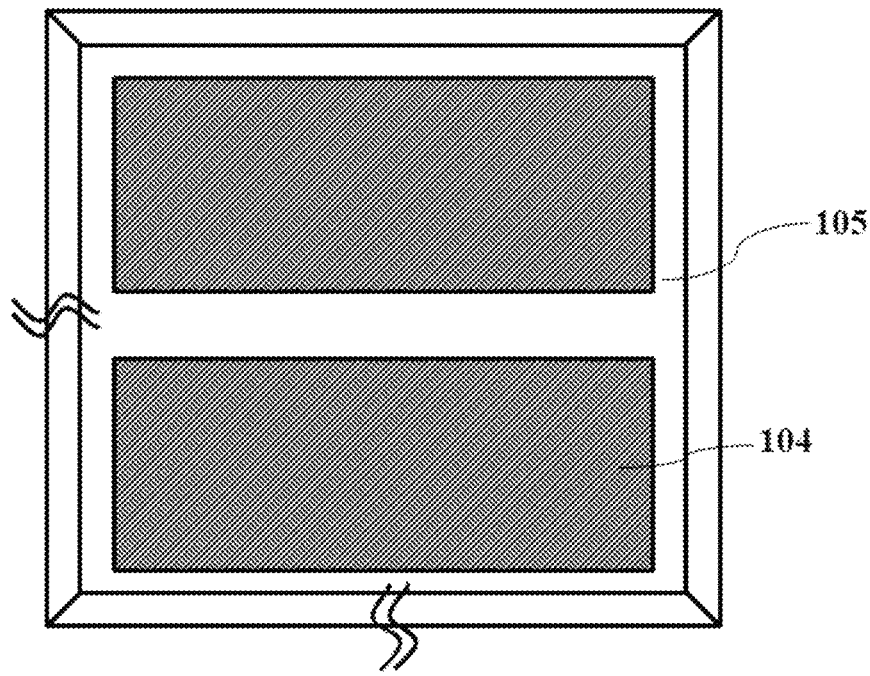
FIG. 2 is a top view of an existing flip-chip LED.

In the drawings:
100: growth substrate; 101: N-type layer; 102: light emitting layer; 103: P-type layer; 104: metal electrode; 105: insulating layer; 106: V-type opening structure; 107: solder paste; 108: reflective layer; 109: W-type opening structure; A: epitaxial bulk layer; B: barrier structure.

DETAILED DESCRIPTION

Various embodiments of the present disclosure will be described in detail with reference to the accompanying drawings and examples, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of this disclosure.

Embodiment 1

Figure 3:
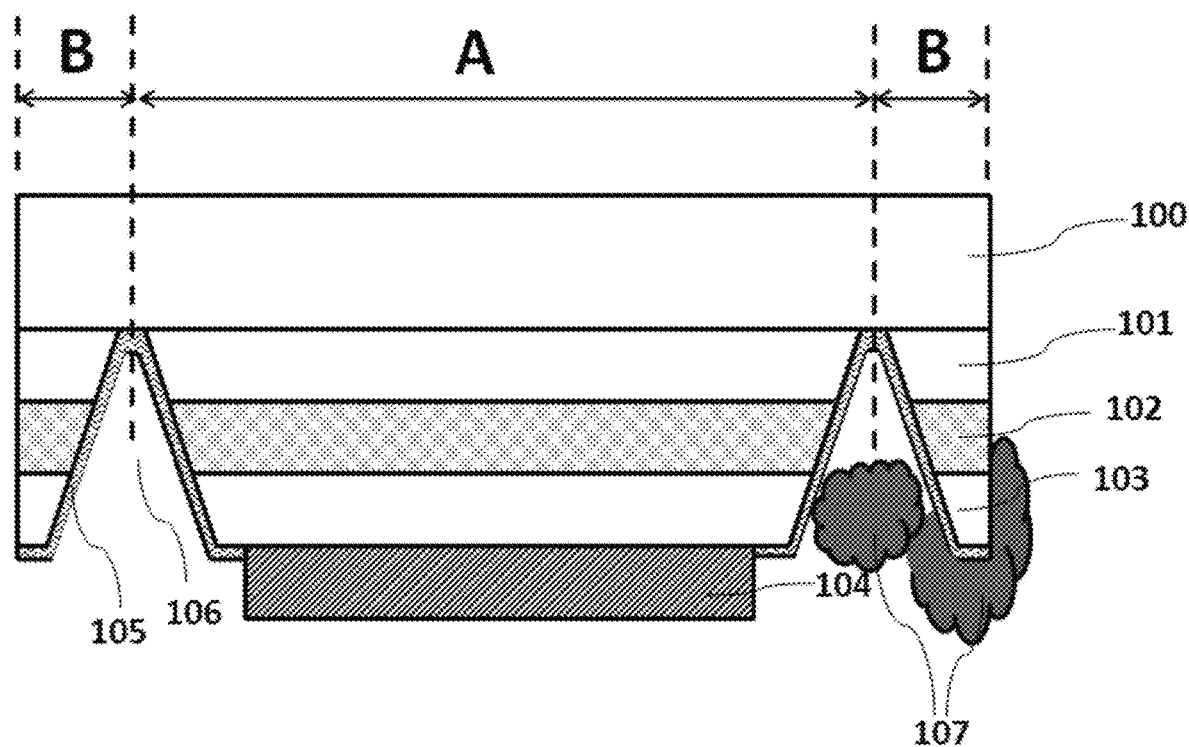
FIG. 3 is a sectional view of the flip chip LED of Embodiment 1 of the present disclosure.
Figure 4:
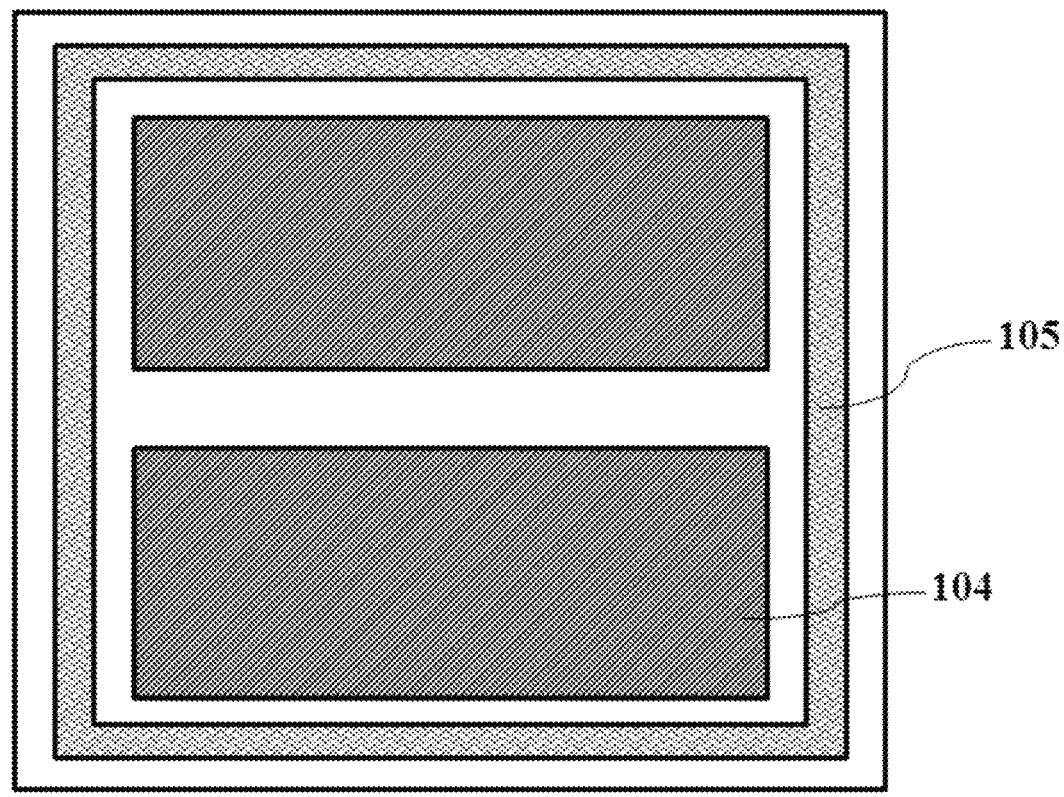
FIG. 4 is a top plan view of the flip chip LED of Embodiment 1 of the present disclosure.

As shown in FIGS. 3 and 4, a GaN-based flip-chip LED, comprises: a growth substrate 100, an N-type layer 101, a light emitting layer 102, a P-type layer 103, a metal electrode 104, an insulating layer 105, a V-type opening structure 106, an epitaxial bulk layer A and a barrier structure B.

Specifically, the above GaN-based flip-chip LED structure comprises a growth substrate 100, which is a sapphire substrate; an epitaxial layer, formed on the light emitting layer 102, wherein, the epitaxial layer comprises an N-type layer 101, a light emitting layer 102 and a P-type layer 103 in successive; a V-type opening structure 106, which is on the epitaxial layer edge and extends to the growth substrate 100 surface, making parts of the side wall of the epitaxial layer and the substrate surface exposed, so that the epitaxial layer is divided into an epitaxial bulk layer A and a barrier structure B. As the barrier structure B is isolated from the epitaxial bulk layer A, it can act as a "barrier wall" to increase soldering tin climbing difficulty as much as possible; in addition, as the chip cutting line is outside the B rather than in the V-type channel, the insulating layer inside the V-type channel is not prone to break due to cutting stress, thus effectively avoiding short circuit caused by overflow of the solder paste 107 in usage of the chip and improving reliability and yield of the flip-chip LED chip; a metal electrode 104, formed on part of the epitaxial bulk layer A; an insulating layer 105, formed on the V-type opening structure 106, as the metal electrode isolating layer.

Embodiment 2

Figure 5:
FIG. 5 is schematic sectional view of a flip-chip LED according to Embodiment 2 illustrating a first step of a fabrication process.

FIGS. 5-9 are the sectional schematic diagrams of the fabrication process of the flip-chip LED structure, details of which are as follows:

As shown in FIG. 5, at first, provide a growth substrate 100; in this embodiment, the growth substrate 100 is sapphire, used for forming the epitaxy substrate of the GaN-based flip-chip LED; however, it should be recognized that, the growth substrate 100 can be silicon carbide, gallium nitride, silicon or other substrates.

Figure 6:
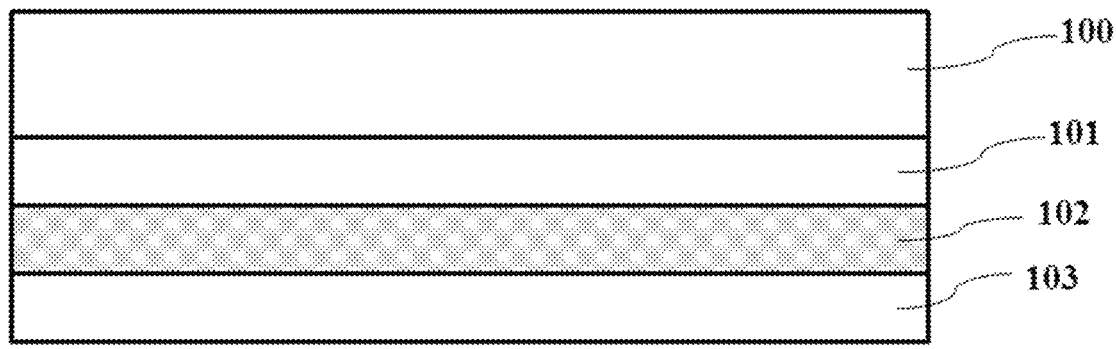
FIG. 6 is schematic sectional view of the flip-chip LED according to Embodiment 2 illustrating a second step of a fabrication process.

As shown in FIG. 6, grow an epitaxial layer on the growth substrate 100, wherein, the epitaxial layer comprises an N—GaN layer 101, a light emitting layer 102 and a P—GaN 103 in successive; further, grow a GaN buffer layer on the growth substrate before growth of the epitaxial layer to get better lattice quality.

Figure 7:
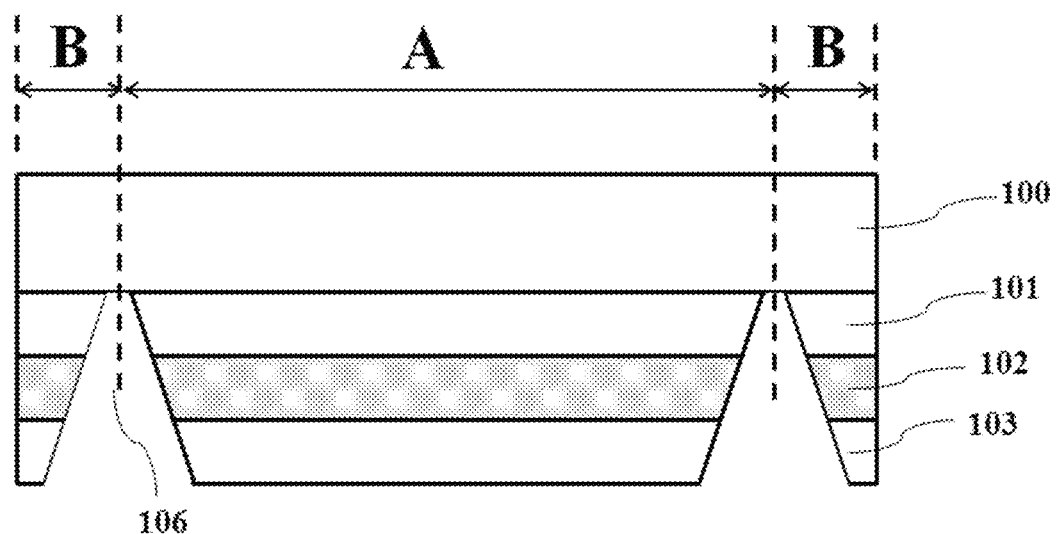
FIG. 7 is schematic sectional view of the flip-chip LED according to Embodiment 2 illustrating a third step of a fabrication process.

As shown in FIG. 7, define the chip size via ICP etching process and etch a V-type opening structure 106 from the P—GaN-layer surface 103 of the epitaxial layer downwards, which extends to the growth substrate 100 surface, making parts of the side wall of the epitaxial layer the substrate surface exposed, so that the epitaxial layer is divided into an epitaxial bulk layer A and a barrier structure B, i.e., the barrier structure B is completely isolated from the epitaxial bulk layer A.

Figure 8:
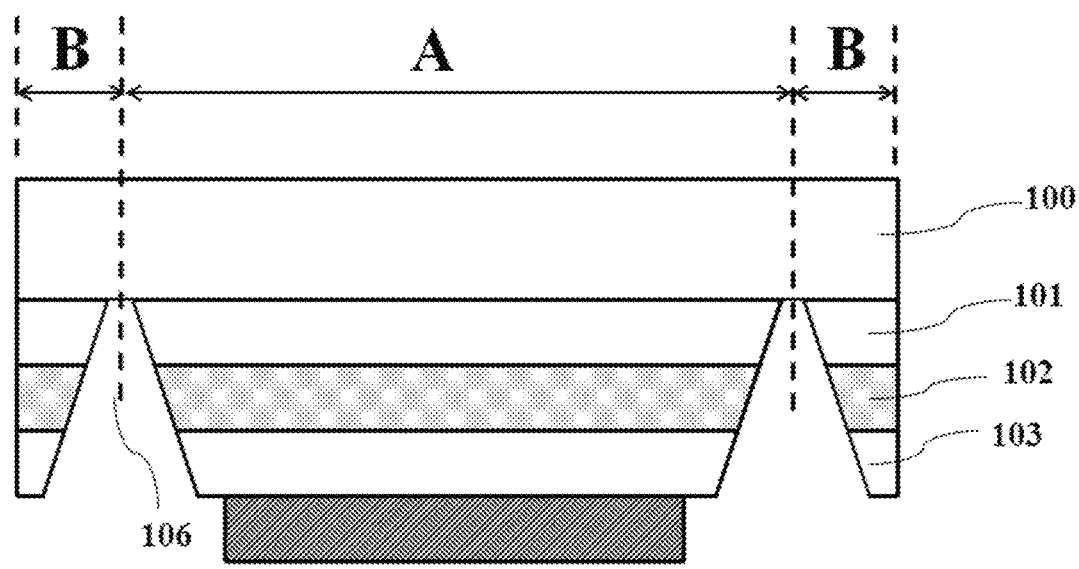
FIG. 8 is schematic sectional view of the flip-chip LED according to Embodiment 2 illustrating a fourth step of a fabrication process.

As shown in FIG. 8, fabricate a metal electrode 104 on part of the epitaxial bulk layer A surface, wherein, the metal electrode 104 prefers to be Cr/Pt/Au material.

Figure 9:
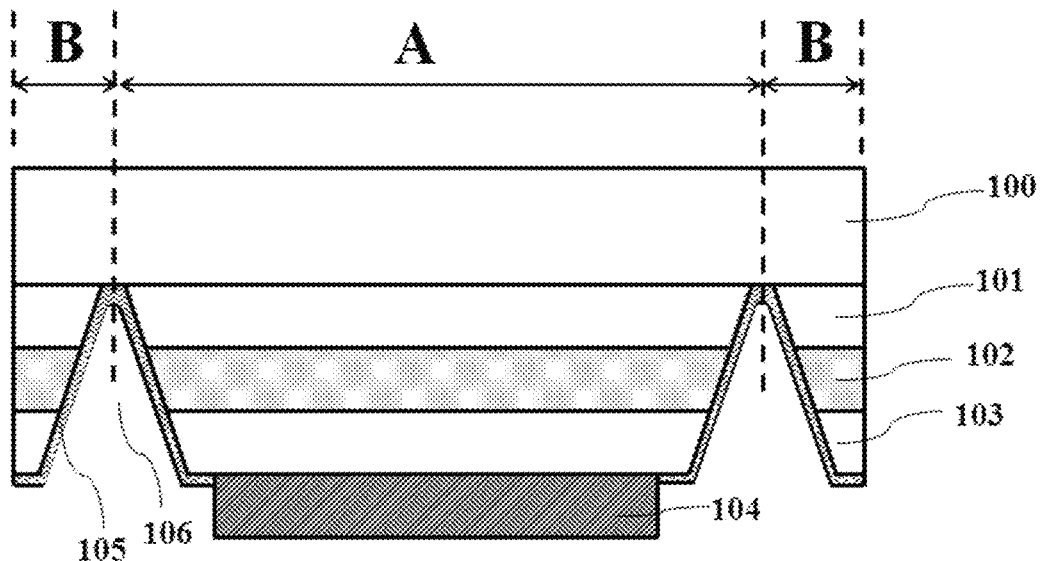
FIG. 9 is schematic sectional view of the flip-chip LED according to Embodiment 2 illustrating a fifth step of a fabrication process.

As shown in FIG. 9, deposit an insulating layer 105 on the V-type opening structure 106, as the metal electrode isolating layer, wherein, the insulating layer 105 is preferably a distributed Bragg reflective layer alternatively stacked by several layers of $SiO_2$ and $TiO_2$; thin and polish the sapphire growth substrate with grinding equipment, and cut the chip through cutting and splitting, wherein, the epitaxial bulk layer A of each chip at least remains a barrier structure B for insulating protection, which effectively protects the epitaxial layer side wall of the chip and overcomes easy break of the cladding material of the insulating layer in conventional chip during chip cutting, thus avoiding short circuit due to overflow of the solder paste or other solid crystal conductive materials in usage of the chip and improving reliability and yield of the flip-chip LED chip; in addition, as the barrier structure B is completely isolated from the epitaxial bulk layer A, even when the insulating layer cladding material breaks on the barrier structure B during chip cutting, it will not cause short circuit due to overflow of the solder paste or other solid crystal conductive materials during usage of the chip, thus effectively improving reliability and yield of the flip-chip LED chip.

Embodiment 3

Figure 10:
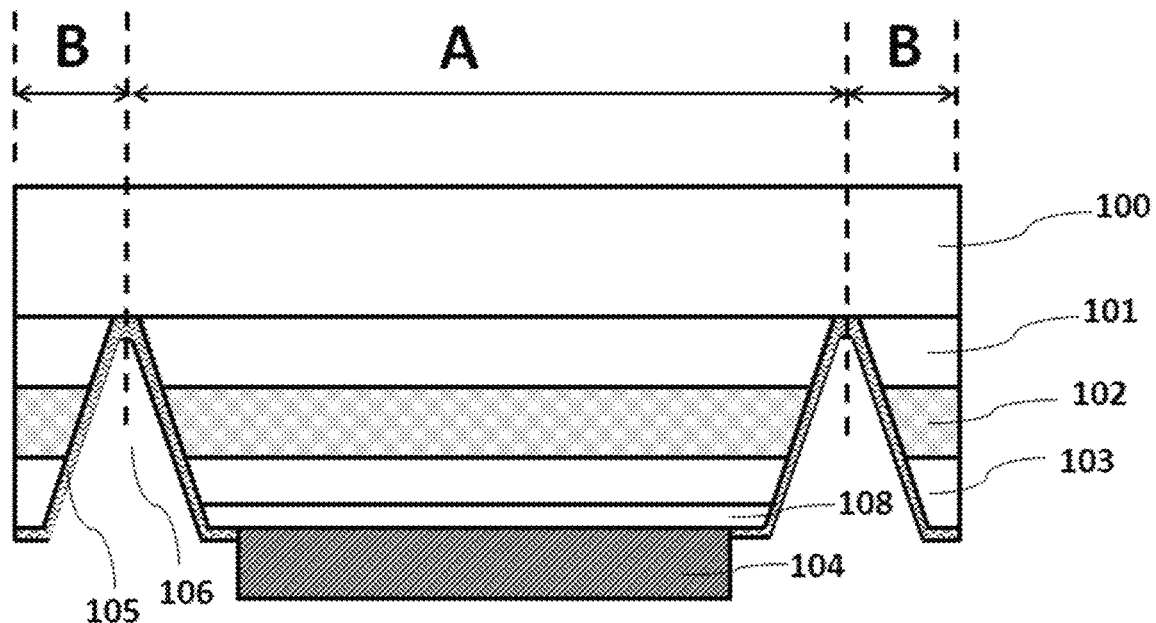
FIG. 10 is a sectional view of a flip chip LED of Embodiment 3 of the present disclosure.

As shown in FIG. 10, different from Embodiment 1, in this embodiment, before forming a V-type opening structure 106 on the epitaxial layer, form a reflective layer 108 at first, wherein, the reflective layer 108 can be a metal reflective layer, a distributed Bragg reflective layer or an omni-directional reflective layer; in this embodiment, the reflective layer 108 is preferably a metal reflective layer, and the metal reflective layer may comprise Ni, Pt, Ag, Al or Rh.

Embodiment 4

Figure 11:
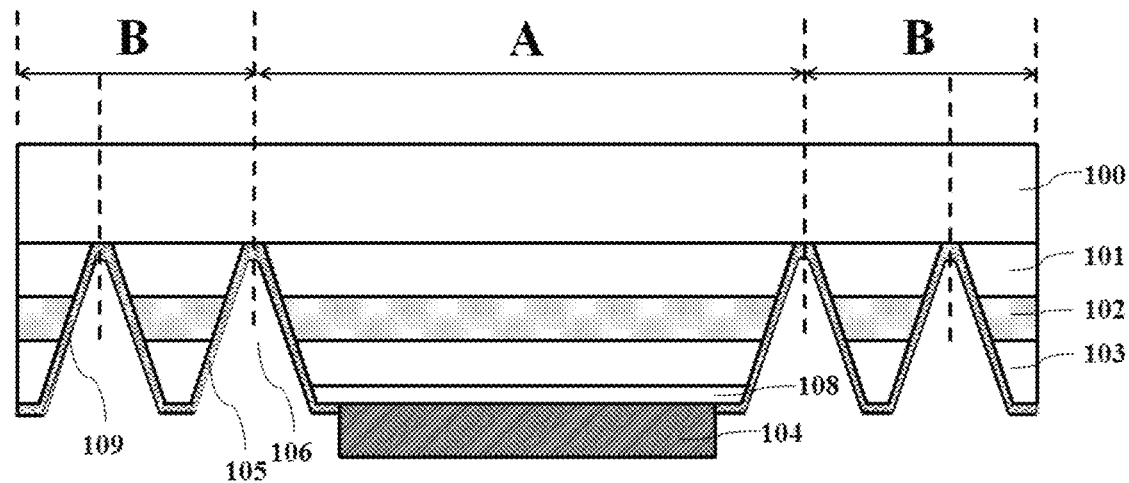
FIG. 11 is a sectional view of a flip chip LED of Embodiment 4 of the present disclosure.
Figure 12:
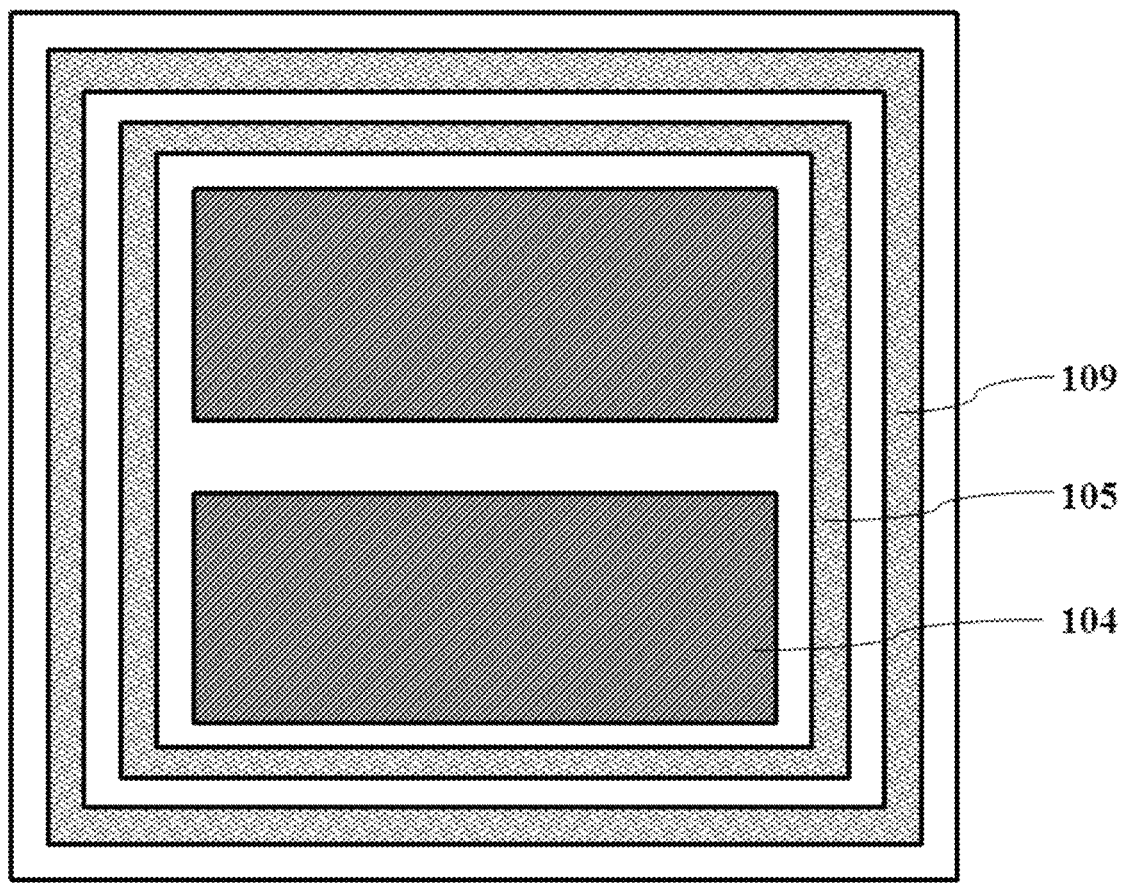
FIG. 12 is a top plan view of the flip chip LED of Embodiment 4 of the present disclosure.

As shown in FIGS. 11 and 12, different from Embodiment 3, in this embodiment, the opening structure formed on the epitaxial layer is W-type (a variant of V-type, i.e., the opening structure is not limited to an one-dimensional grating, but can be a combination of two or several V-type barriers, and the barrier shape is not limited to V-type, but can be U-type or other curve shapes) rather than V-type; it should be noted that in the W-type opening structure 109, the V-type opening that is far from the epitaxial layer edge extends to the substrate 100 surface, while the V-type opening in the W-type opening structure 109 close to the epitaxial layer edge is an concave structure for blocking and may not extend to the substrate 100 surface.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A flip-chip light emitting diode (LED) comprising:
   a single-layer substrate;
   an epitaxial layer over the substrate, wherein the epitaxial layer comprises: a first semiconductor layer, a second semiconductor layer, and a light emitting layer between the first semiconductor layer and the second semiconductor layer;
   a plurality of opening structures at an edge of the epitaxial layer and extending to a surface of the substrate, thereby exposing a portion of a sidewall of the epitaxial layer and a portion of the surface of the substrate, such that the epitaxial layer is divided into an epitaxial bulk layer and a barrier structure, wherein the epitaxial bulk layer is completely isolated from the barrier structure and is different from the barrier structure;
   a metal electrode formed on a portion of the epitaxial bulk layer;
   a reflective layer formed over the epitaxial layer prior to the plurality of opening structures are formed such that the reflective layer is discontinuous laterally over a bottom of the plurality of opening structures and is present between two of the plurality of opening structures; and
   an insulating layer over the opening structure as an isolating layer for the metal electrode.

2. The flip-chip LED of claim 1, wherein the barrier structure is configured to avoid short-circuit caused by overflow of solder paste or other solid crystal conductive materials during usage of the flip-chip LED even if the insulating layer over the opening structure breaks, and improve reliability and yield of the flip-chip LED; and wherein the substrate is a single-layer sapphire substrate.

3. The flip-chip LED of claim 1, wherein the opening structure comprises at least one of a "U"-shaped, a "V"-shaped, or a "W"-shaped opening.

4. The flip-chip LED of claim 1, wherein the reflective layer is a metal reflective layer, a distributed Bragg reflective layer, or an omni-directional reflective layer.

5. The flip-chip LED of claim 1, wherein the metal electrode is formed on the portion of the epitaxial layer after the insulating layer is formed.

6. A fabrication method of a flip-chip light emitting diode (LED), the method comprising:
   1) providing a single-layer substrate;
   2) fabricating an epitaxial layer over the substrate, wherein the epitaxial layer comprises: a first semiconductor layer, a second semiconductor layer, and a light emitting layer between the first semiconductor layer and the second semiconductor layer;
   3) etching a plurality of opening structures downward from a surface of the epitaxial layer, to a surface of the substrate surface, thereby exposing a portion of a sidewall of the epitaxial layer and a portion of the surface of the substrate, such that the epitaxial layer is divided into an epitaxial bulk layer and a barrier structure; and
   4) depositing an insulating layer on the opening structure as a metal electrode isolating layer;
   wherein the fabricated flip-chip LED comprises:
   the substrate;
   the epitaxial layer over the substrate, wherein the epitaxial layer comprises: the first semiconductor layer, the second semiconductor layer, and the light emitting layer between the first semiconductor layer and the second semiconductor layer;
   the plurality of opening structures at an edge of the epitaxial layer and extending to the surface of the substrate, thereby exposing the portion of the sidewall of the epitaxial layer and the portion of the surface of the substrate, such that the epitaxial layer is divided into the epitaxial bulk layer and the barrier structure, wherein the epitaxial bulk layer is completely isolated from the barrier structure and is different from the barrier structure;
   a reflective layer formed over the epitaxial layer prior to the plurality of opening structures are formed such that the reflective layer is discontinuous laterally over a bottom of the a plurality of opening structures and is present between two of the plurality of opening structures; and the insulating layer over the opening structure as a metal electrode isolating layer;

the fabrication method further comprising forming a metal electrode on a portion of the epitaxial layer after the insulating layer is formed.

7. The fabrication method of claim 6, wherein the barrier structure is configured to avoid a short-circuit of the flip-chip LED caused by overflow of solder paste or other solid crystal conductive materials during usage of the flip-chip LED even if the insulating layer over the opening structure breaks, and improve reliability and yield of the flip-chip LED.

8. The fabrication method of claim 6, wherein the opening structure comprises at least one of a "U"-shaped, a "V"-shaped, or a "W"-shaped opening.

9. A light emitting system comprising a plurality of flip-chip light emitting diodes (LEDs), each LED comprising:

a single-layer substrate;

an epitaxial layer over the substrate, wherein the epitaxial layer comprises: a first semiconductor layer, a second semiconductor layer, and a light emitting layer between the first semiconductor layer and the second semiconductor layer;

a plurality of opening structures at an edge of the epitaxial layer and extending to a surface of the substrate, thereby exposing a portion of a sidewall of the epitaxial layer and a portion of the surface of the substrate, such that the epitaxial layer is divided into an epitaxial bulk layer and a barrier structure, wherein the epitaxial bulk layer is completely isolated from the barrier structure and is different from the barrier structure;

a metal electrode formed on a portion of the epitaxial bulk layer;

a reflective layer formed over the epitaxial layer prior to the plurality of opening structures are formed such that the reflective layer is discontinuous laterally over a bottom of the a plurality of opening structures and is present between two of the plurality of opening structures; and an insulating layer over the opening structure as an isolating layer for the metal electrode.

10. The system of claim 9, wherein the barrier structure is configured to avoid short-circuit caused by overflow of solder paste or other solid crystal conductive materials during usage of the flip-chip LED even if the insulating layer over the opening structure breaks, and improve reliability and yield of the flip-chip LED.

11. The system of claim 9, wherein the opening structure comprises at least one of a "U"-shaped, a "V"-shaped, or a "W"-shaped opening.

12. The system of claim 9, wherein the reflective layer is a metal reflective layer, a distributed Bragg reflective layer, or an omni-directional reflective layer.

13. The system of claim 9, wherein the metal electrode is formed on the portion of the epitaxial layer after the insulating layer is formed.

* * * * *